(12) United States Patent
Kuroda et al.

(10) Patent No.: US 7,333,253 B2
(45) Date of Patent: Feb. 19, 2008

(54) MULTIPLEX RECORDING TYPE HOLOGRAM RECORDING DEVICE, METHOD, HOLOGRAM REPRODUCTION DEVICE, AND METHOD

(75) Inventors: Kazuo Kuroda, Saitama (JP); Satoshi Sugiura, Saitama (JP); Shuuichi Yanagisawa, Saitama (JP); Satoru Tanaka, Saitama (JP); Yoshihisa Itoh, Saitama (JP); Akihiro Tachibana, Saitama (JP); Yoshihisa Kubota, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/514,815

(22) PCT Filed: May 19, 2003

(86) PCT No.: PCT/JP03/06206

§ 371 (c)(1),
(2), (4) Date: Jun. 13, 2005

(87) PCT Pub. No.: WO03/098361

PCT Pub. Date: Nov. 27, 2003

(65) Prior Publication Data

US 2005/0232125 A1    Oct. 20, 2005

(30) Foreign Application Priority Data

May 17, 2002  (JP)  ............... 2002-143769

(51) Int. Cl.
*G11B 7/00*  (2006.01)
(52) U.S. Cl. .............................. 359/24; 359/12; 359/30
(58) Field of Classification Search .................. 359/12, 359/24, 30, 35
See application file for complete search history.

(56) References Cited

U.S. PATENT DOCUMENTS 6,317,404 B1 * 11/2001 Kawano et al. ............. 369/103
2003/0039001 A1 * 2/2003 King et al. .................... 359/35

FOREIGN PATENT DOCUMENTS

JP  2000-284671  10/2000
JP  2000-284676  10/2000

* cited by examiner

*Primary Examiner*—Fayez G. Assaf
(74) *Attorney, Agent, or Firm*—Young & Thompson

(57) ABSTRACT

A hologram record apparatus (100) includes a parameter set device (19), a move device (20), and a control device (18). The parameter set device (19) modifies parameters for multiple recordings such as a record angle and a focal depth in relation to at least one of signal light (L3) and reference light (L2) and can fix the parameters. The move device (20) relatively moves the focus position of the signal light and the reference light in the direction along the record surface of a hologram record medium. The control device (18) performs control so that the parameter for the last recording used for recording at the m-th focus position is used as the parameter for the first recording at the m+1-th focus position.

8 Claims, 5 Drawing Sheets

MULTIPLEX RECORDING TYPE HOLOGRAM RECORDING DEVICE, METHOD, HOLOGRAM REPRODUCTION DEVICE, AND METHOD

TECHNICAL FIELD

The present invention relates to: a hologram record apparatus for and method of irradiating a hologram record medium with signal light via a spatial light modulator to record information; and a hologram reproduction apparatus for and method of reproducing the information from the hologram record medium. In particular, the present invention relates to a multiple record type hologram record apparatus for and method of, as well as the hologram reproduction apparatus for and method of multiply recording different information in the same record area by changing an angle, a focal depth and so on of reference light and the signal light relative to the surface of the hologram record medium, and performing such multiple recording on a plurality of record areas, and reproducing the recorded information.

BACKGROUND ART

Heretofore, a hologram record apparatus, which may be provided with a liquid crystal device and the like, irradiates a spatial light modulator for modulating light depending on record information to be recorded, with laser light as signal light. Particularly, in the spatial light modulator, cells are arranged planarly in a matrix so that the signal light is modulated by changing light transmittance of each cell depending on the record information. Furthermore, the modulated light is outputted with different output angles, as a plurality of diffraction light, such as zeroth-order light, or 1st-order light and so on, duo to diffraction phenomenon in the cell having a fine pitch. In this case, the output angle is defined by the cell pitch, which indicates an modulation unit. Then, the signal light modulated with the spatial light modulator constructed as above and reference light not passed through the spatial light modulator are interfered on the hologram record medium. Thereby, the record information is recorded as a wavefront on the hologram record medium.

An angle-multiplex type hologram record apparatus is proposed for multiply recording different information in the same area, by changing little by little a surface angle of the hologram record medium relative to the reference light and the signal light, particularly during recording. In the present application, the angle of the signal light relative to the hologram record medium surface in such an angle-multiplex type recording is referred to as a "record angle" as appropriate. Furthermore, an angle as a standard of the record angle, such as the record angle when it corresponds to a normal line of the hologram record medium surface, is referred to as a "standard record angle". Still further, in the present application, each record plane corresponding to each record angle is referred to as an "angle record plane", and a record plane corresponding to the standard record angle is referred to as a "standard angle record plane".

On the other hand, a hologram reproduction apparatus consisting a pair with the hologram record apparatus is designed to reproduce the record information multiply recorded in the same area, by changing little by little the surface angle of the hologram record medium relative to the reproduction illumination light. In the present application, the angle of the reproduction light relative to the hologram record medium surface in such an angle-multiplex type reproduction is referred to as a "reproduction angle" as appropriate. Furthermore, an angle as a standard of the reproduction angle, such as the reproduction angle when it corresponds to a normal line of the hologram record medium, is referred to as a "standard reproduction angle".

In the angle-multiplex type hologram record apparatus, recording to each angle record plane in the same record area are successively performed for each record angle, by changing the record angle in the maximum range with increment or decrement 0.01 degree from the standard record angle (e.g. by changing little by little in the range of 88-92 degree). Incidentally, in the present application, an area on the hologram record medium surface onto which the signal light and the reference light are irradiated together is referred to as a "record area". In the angle-multiplex type recording, a plurality of angle record planes such as 50 planes is recorded in the same record area.

On the other hand, in the angle-multiplex type hologram reproduction apparatus, the record information multiply recorded in the same area is reproduced for each reproduction angle, by changing little by little the reproduction angle from the standard reproduction angle in response to the record angle.

Thus, in the angle-multiplex type hologram record apparatus and hologram reproduction apparatus, the record information can be recorded respectively on a plurality of angle record planes recorded for each record angle in the same record area, and the recorded information can be reproduced respectively. Therefore, record density and recording capacity are expected to be remarkably increased.

In addition to the aforementioned angle-multiplex system, various multiplex systems are proposed, such as a focal-depth-multiplex system for performing multiple recordings with various focal depths of the signal light entering the hologram record medium, a reference light phase-code-multiplex system for performing multiple recordings with various phases of the reference light, a reference light amplitude-multiplex system for performing multiple recordings with various amplitudes of the reference light, a reference light polarization-multiplex system for performing multiple recordings with various polarizations of the reference light and so on. Also in these multiplex systems, since a plurality of record information can be multiply recorded in the same record area, the record density and the recording capacity is expected to be remarkably increased.

Incidentally, in general, it is not practical to perform the multiple recordings onto a whole surface of one hologram record medium at one time, in view of a record plane area of all-purpose size of the hologram record medium, expansion of the signal light and the reference light obtained from an optic system, such as a multi-purpose lens, on the record plane, size or optical performance of a multi-purpose spatial light modulator or lens and so on.

For this, a technology is presented for dividing the record plane of the hologram record medium into a plurality of record areas sized suitably to be irradiated with the signal light and the reference light, performing the multiple recordings as mentioned above for each record area, and after the multiple recordings for one record area is completed, moving to the next record area and starting the multiple recordings and then repeating these processes.

DISCLOSURE OF INVENTION

However, resetting, changing and fixing parameters for the multiple recordings (e.g. the aforementioned angle, the focal depth, the phase, the polarization, the amplitude and so on of the signal light or the like) involves changing the optical system setting state or mechanical state in the hologram record apparatus and the hologram reproduction apparatus, and thereby consumes considerable time period for each change. Particularly, since such a change requires very high accuracy, as seen from high selectivity of the angle as mentioned above, it is basically difficult to perform each change process itself for a short time.

As the result, it is very difficult technically to perform the recording process quickly, if a series of recording processes is performed, including as mentioned above resetting parameters for the multiple recordings to one record area, performing the multiple recordings with the parameter being changed sequentially from the standard value, and after this is completed, moving to the next record area, and then repeating resetting the parameter and performing the multiple recordings with the parameter being changed from the standard value. Similarly, it is very difficult technically to perform the reproduction process quickly, if a series of reproduction processes is performed, including resetting parameters for the multiple recordings to one record area, performing the reproduction with the parameter being changed sequentially from the standard value, and after this is completed, moving to the next record area, and then repeating resetting the parameter and performing the reproduction with the parameter being changed from the standard value.

The present invention has been accomplished in view of above problems. It is therefore an object of the present invention to provide a multiple record type hologram record apparatus and method, and a hologram reproduction apparatus and method capable of increasing record density and recording capacity and performing accurate and quick recording and reproduction.

The multiple record type hologram record apparatus of the present invention in order to solve the above problems comprises: a light source for performing an irradiation with source light including signal light and reference light; a spatial light modulator disposed in an optical path of the signal light and capable of modulating the signal light; an optical system for introducing the signal light after passed through said spatial light modulator and the reference light onto a hologram record medium; a move device for moving a focus position of the signal light and the reference light introduced by said optical system, relative to the hologram record medium in a direction along a surface of the hologram record medium; a parameter set device capable of changing and fixing a predetermined kind of parameters for multiple recordings for at least one of the signal light and the reference light; and a control device for controlling said parameter set device to perform a recording by using the parameters used for the last recording at the m-th focus position (m is natural number) as the parameters for the first recording at the (m+1)-th focus position.

According to the hologram record apparatus of the present invention, during its operation, the light source such as a semiconductor laser device performs the irradiation with the source light such as laser beam. The source light includes the signal light and the reference light. Here, the spatial light modulator, which may be provided with a liquid crystal device or the like, disposed in the optical path of the signal light modulates the signal light. Then, the optical system introduces the modulated signal light and the reference light onto the hologram record medium. As the result, the record information is recorded as a wavefront on the hologram record medium due to the interference of the signal light and the reference light.

Incidentally, the signal light and the reference light included in the source light may be arranged so that they are split from each other at an optical system such as a beam splitter and then the signal light is introduced into the spatial eight modulator and the reference light is not introduced into the spatial light modulator. Alternatively, the signal light and the reference light included in the source light may be arranged so that they are not split and both of them are introduced into the spatial light modulator. In the latter case, employing a so-called "self-coupling method", Fourier zeroth-order component of the signal light outputted from the spatial light modulator may be functioned as the reference light. In this case, the reference light does not need to have phase information.

The parameter set device changes the parameter for the multiple recording under control of the control device, on recording in the same record area. The "parameter for the multiple recording" means property or attribute of the reproduction illumination light, the reference light or the signal light allowing the multiple recording in the same record area, such as the relative angle of the signal light and the reference light or the reproduction illumination light relative to the record plane of the hologram record medium in the angle-multiplex system, the focal depth in the focal-depth-multiplex system, the phase in the phase-code-multiplex system, the amplitude in the amplitude-multiplex system, the polarization in the polarization-multiplex system and so on, which can be changed and fixed to a predetermined value by the parameter set device of the invention.

On the other hand, the move device moves the focus position of the signal light and the reference light relatively in a direction along the record surface of the hologram record medium, under control of the control device when the record area is changed.

Particularly, under control of the control device, the parameter used for the last recording at the m-th focus position is used as the parameter for the first recording at the m+1-th focus position to which the move device moves the record medium. Therefore, comparing a case of resetting the parameter for the multiple recordings by the parameter set device after the move device moves the hologram record medium, and changing the parameter for the multiple recordings from an after-reset standard value, this embodiment makes it possible to provide the quick recording, because the parameter does not need to be changed by the parameter set device after moving the recording medium. Particularly, since the angle selectivity of the hologram record medium in the angle-multiplex system is very high, such a resetting needs to be performed with high accuracy, and therefore the quick resetting is technically difficult. For this, the present invention not involving resetting is very advantageous to perform the quick recording. Additionally, it is technically difficult to perform such a resetting with high accuracy, even if it is performed with an enough time period. Therefore, an error may be caused on resetting. For example, before or after the record area is changed in the angle-multiplex system, the angle record plane to be the standard angle record plane may practically deviate slightly from the standard angle record plane. Furthermore, such a phenomenon may cause irregularly every time when the record area is changed. Alternatively, before or after the record area is changed in the focal depth multiples system, the focal depth to be the standard focal depth may practically deviate slightly from the standard focal depth.

On the contrary, in the present invention, it is not necessary to reset the parameter for the multiple recordings when the record area is changed. Therefore, these problems hardly arise, which is further advantageous.

Thus, in the present invention, the multiple recordings remarkably increases the record density and the recording capacity, and makes it possible to perform the quick recording.

Incidentally, in the present invention, the spatial light modulator may be adapted to perform a binary modulation in response to binary data indicated by the record information. Thereby, the record information indicating the binary data can be recorded onto the hologram record medium with a high record density. Alternatively, it is possible to perform a multi-level modulation in response to gray scale data indicated by the record information. Thereby, the record information indicating the gray scale data can be recorded onto the hologram record medium with a high record density.

Furthermore, in the present invention, the modulated light outputted from the spatial light modulator comprises at least one of the zeroth-order diffraction light and L-th order diffraction light (L is natural number not less than 1). For example, the hologram recording can be performed with high record density, by using only the zeroth-order diffraction light, or by using the zeroth-order diffraction light and one or more 1st-order or higher-order diffraction light.

In an aspect of the multiple record type hologram record apparatus according to the present invention, the control device controls the parameter set device to change the parameter in an order from the first to the n-th (n is natural number not less than 2) on the recording at the m-th focus position and change the parameter in an upside down order on the recording at the (m+1)-th focus position.

According to this aspect, if parameter in one record area is set in the order that: the first value, the second value, . . . , the (n−1)-th value and the n-th value, parameters in the next record area after the focus position is moved by the move device is set in the order that: the n-th value, the (n−1)-th value, . . . , the second value and the first value. Therefore, it is not necessary to reset or change parameter immediately after the moving. Furthermore, in this case, if a parameter change sequence in one record area corresponds to, for example, a sequence in which the angle increases little by little, or a sequence in which the focal depth increases little by little, a parameter change sequence in the next record area corresponds to, for example, a sequence in which the angle decreases little by little, or a sequence in which the focal depth decreases little by little. That is, it is not necessary to reset or change parameters immediately after the moving, and further the parameters can be changed in a simple increase/simple decrease for both record area before and after the moving, which is easy to control, and still further a change extent for each change can be minimized. From these effects, it is possible to further improve the accuracy to change or fix the parameters.

Additionally, it is preferable that a rule about the standard parameter (e.g. the standard record angle, the standard focal depth, etc.) to be a standard or basis in each record area and the recording sequence of the record area is set in advance, and then the recording is always performed according to them. For example, the rule about the standard record angle in each record area and the recording sequence is set, for example, in the angle-multiplex system, the angle is increased by a fine angle $\Delta\theta$ from the standard record angle $-\theta$ to the record angle $+\theta$, in relation to the j-th record area; the angle is decreased by a fine angle $\Delta\theta$ from the standard record angle $+\theta$ to the record angle $-\theta$, in relation to the (j+1)-th record area; the angle is increased by a fine angle $\Delta\theta$ from the standard record angle $-\theta$ to the record angle $+\theta$, in relation to the (j+2)-th record area, and then the recording may be performed according to them. Alternatively, the rule about the standard recording depth in each record area and the recording sequence is set, for example, in the focal-depth-multiplex system, the depth is increased by a fine depth $\Delta d$ from the standard focal depth $-d$ to the focal depth $+d$, in relation to the j-th record area; the focal depth is decreased by a fine depth $\Delta d$ from the standard focal depth $+d$ to the focal depth $-d$, in relation to the (j+1)-th record area; the focal depth is increased by a fine depth $\Delta d$ from the standard focal depth $-d$ to the focal depth $+d$, in relation to the (j+2)-th record area, and then the recording may be performed according to them. Thus, by setting the rule about the standard parameter in each record area and the recording sequence of the record area in advance, and performing always the recording according to them, it becomes unnecessary to record or read the information for indicating the recording sequence or the information for indicating the standard parameter in each record area and the like onto or from the hologram record medium. That is, on reproduction, the record information that is multiply recorded in each record area can be reproduced without problems, by reproducing it according to the rule based on the ordinal number of the record area.

In another aspect of the multiple record type hologram record apparatus according to the present invention, the parameter set device includes at least one of: a device for changing and fixing an incident angle of the signal light entering the hologram record medium; a device for changing and fixing a focal depth of the signal light entering the hologram record device; a device for changing and fixing a phase of the reference light; a device for changing and fixing an amplitude of the reference light; and a device for changing and fixing polarization of the reference light.

According to this aspect, in at least one of the angle-multiplex system, the focal-depth multiplex system, the phase-code multiplex system, the amplitude-multiplex system and the polarization-multiplex system, the record density and the record capacity can be remarkably increased. Furthermore, in any type, it is not necessary to reset the parameters (i.e. resetting the reproduction light angle, the focal depth, the phase, the amplitude, the polarization, etc.) when the record area is changed, and thereby the quick recording can be performed.

The multiple record type hologram reproduction apparatus of the present invention in order to solve the above problems comprises: a light source for irradiating a multiple record type hologram record medium with reproduction illumination light; a photoreceptor for receiving reproduction light based on the reproduction illumination light from the hologram record medium; a read device for reading record information recorded on the hologram record medium on the basis of the received reproduction light; a move device for moving a focus position of the reproduction illumination light relative to the hologram record medium in a direction along a surface of the hologram record medium; a parameter set device capable of changing and fixing a predetermined kind of parameter for multiple recordings relating to the reproduction illumination light; and a control device for controlling said parameter set device to perform a reproduction by using the parameters used at the last reproduction at the m-th focus position (m is natural number) as the parameters for the first reproduction at the (m+1)-th focus position.

According to the multiple record type hologram reproduction apparatus of the present invention, during its operation, the light source such as the semiconductor laser device or the like performs the irradiation with the reproduction illumination light such as laser beam or the like. Then, the photoreceptor including a photodiode array, a CCD (Charge Coupled Device) and the like receives the reproduction light based on the reproduction illumination light from the hologram record medium. The "reproduction light" herein means the zeroth-order light, or the 1st-order or higher order light, which are arisen when the hologram record medium is irradiated with the reproduction illumination light corresponding to the reference light for recording. Next, on the basis of the reproduction light received by the photoreceptor, the read device reads a plurality of record information recorded for each parameter in each record area.

The parameter set device changes the parameter for the multiple recording, on reproduction in the same record area under control of the control device.

On the other hand, the move device moves the focus position of the reproduction illumination light relatively in a direction along the record surface of the hologram record medium, under control of the control device when the record area is changed.

Particularly, under control of the control device, the parameter used for the last reproduction at the m-th focus position is used as the parameter for the first reproduction at the (m+1)-th focus position to which the move device moves the record medium. Therefore, when the move device moves the hologram record medium, it is not necessary to change the parameters by the parameter set device after the moving, which presents the quick reproduction, in comparison with a case that the parameter set device resets parameters for the multiple recordings after the moving and changes parameters for the multiple recordings from the after-reset standard value. Particularly, since the angle selectivity of the hologram record medium is very high in the angle-multiplex system for example, such a resetting is need to be performed with high accuracy, which makes the quick resetting technically difficult. For this, the present invention without resetting is very advantageous for the quick reproduction. Additionally, since such a resetting itself is technically difficult to be performed with high accuracy, even if it is performed with enough time period, error may be occurred on resetting.

On the contrary, in the present invention, it is not necessary to reset parameters for the multiple recordings when the record area is changed. Thereby, the above problems hardly arise, which is further advantageous.

Thus, according to the present invention, the multiple recordings remarkably increases the record density and the recording capacity, and further makes it possible to perform the quick reproduction.

In an aspect of the hologram reproduction apparatus according to the present invention, the control device controls the parameter set device to change the parameter in an order from the first to the n-th (n is natural number not less than 2) on the reproduction at the m-the focus position and change the parameter in an upside down order on the reproducing at the (m+1)-th focus position.

According to this aspect, if the parameter in one record area is set in the order that: the first value, the second value, . . . , the (n−1)-th value and the n-th value, the parameter in the next record area after the move device moves the focus position, is set in the order that: the n-th value, the (n−1)-th value, . . . , the second value and the first value. Therefore, it is not necessary to reset or change the parameter immediately after the moving. Furthermore, in one record area, if the parameter change sequence corresponds to a sequence in which the angle increased little by little, or a sequence in which the focal depth increases little by little, the parameter change sequence in the next record area corresponds to a sequence in which the angle decreases little by little, or a sequence in which the focal depth decreases little by little. That is, it is not necessary to reset or change parameters immediately after the moving, and further the parameters can be changed in a simple increase/simple decrease for both record areas before and after the moving, which is easy to control, and still further a change extent for each change can be minimized. From these effects, it is possible to further improve the accuracy to change or fix the parameters.

In another aspect of the hologram reproduction apparatus according to the present invention, the parameter set device includes at least one of: a device for changing and fixing an incident angle of the reproduction illumination light entering the hologram record medium; a device for changing and fixing a focal depth of the reproduction illumination light entering the hologram record device; a device for changing and fixing a phase of the reproduction illumination light; a device for changing and fixing an amplitude of the reproduction illumination light; and a device for changing and fixing polarization of the reproduction illumination light.

According to this aspect, in at least one of the angle-multiplex system, the focal-depth-multiplex system, the phase-code-multiplex system, the amplitude-multiplex system and the polarization-multiplex system, the record density and the recording capacity can be remarkably increased. Furthermore, in any system, it is not necessary to reset the parameters (i.e. resetting the reproduction light angle, the focal depth, the phase, the amplitude, the polarization, etc.) when the record area is changed, and thereby the quick recording can be performed.

The multiple record type hologram record method of the present invention in order to solve the above problems is a multiple record type hologram record method of recording information to a hologram record medium in a multiple record type hologram record apparatus comprising: a light source for performing an irradiation with source light including signal light and reference light; a spatial light modulator disposed in an optical path of the signal light and capable of modulating the signal light; an optical system for introducing the signal light after passed through said spatial light modulator and the reference light onto the hologram record medium; a move device for moving a focus position of the signal light and the reference light introduced by said optical system, relative to the hologram record medium in a direction along a surface of the hologram record medium; and a parameter set device capable of changing and fixing a predetermined kind of parameter for multiple recording for at least one of the signal light and the reference light, the method comprising: a move process of moving the hologram record medium by the move device; and a control process of controlling the parameter set device to perform a recording by using the parameter used for the last recording at the m-th focus position (m is natural number) as the parameter for the first recording at the (m+1)-th focus position.

According to the multiple record type hologram record method of the present invention, similarly to the aforementioned hologram record apparatus of the present invention, the multiple recordings remarkably increases the record density and the recording capacity, and further makes it possible to perform the quick recording.

The multiple record type hologram reproduction method of the present invention in order to solve the above problem is a multiple record type hologram reproduction method of reproducing information recorded in a multiple record type hologram record medium in a multiple record type hologram reproduction apparatus comprising: a light source for irradiating the hologram record medium with reproduction illumination light; a photoreceptor for receiving reproduction light based on the reproduction illumination light from the hologram record medium; a read device for reading record information recorded on the hologram record medium on the basis of the received reproduction light; a move device for moving a focus position of the reproduction illumination light relative to the hologram record medium in a direction along a surface of the hologram record medium; and a parameter set device capable of changing and fixing a predetermined kind of parameter for multiple recording relating to the reproduction illumination light, the method comprising: a move process of moving the hologram record medium by the move device; and a control process of controlling the parameter set device to perform a reproduction by using the parameter used at the last reproduction at the m-th focus position (m is natural number) as the parameter for the first reproduction at the (m+1)-th focus position.

According to the multiple record type hologram reproduction method of the present invention, similarly to the aforementioned hologram reproduction apparatus of the present invention, the multiple recordings remarkably increases the record density and the recording capacity, and further makes it possible to perform the quick reproduction.

The aforementioned effect and other advantages of the present invention will be apparent from the following embodiments.

BEST MODE FOR CARRYING OUT THE INVENTION

Now, embodiments of the present invention will be explained, with reference to drawings.

First Embodiment of Hologram Record Apparatus

The first embodiment of the hologram record apparatus of the present invention will be discussed, with reference to FIG. 1 to FIG. 4.

Figure 1:
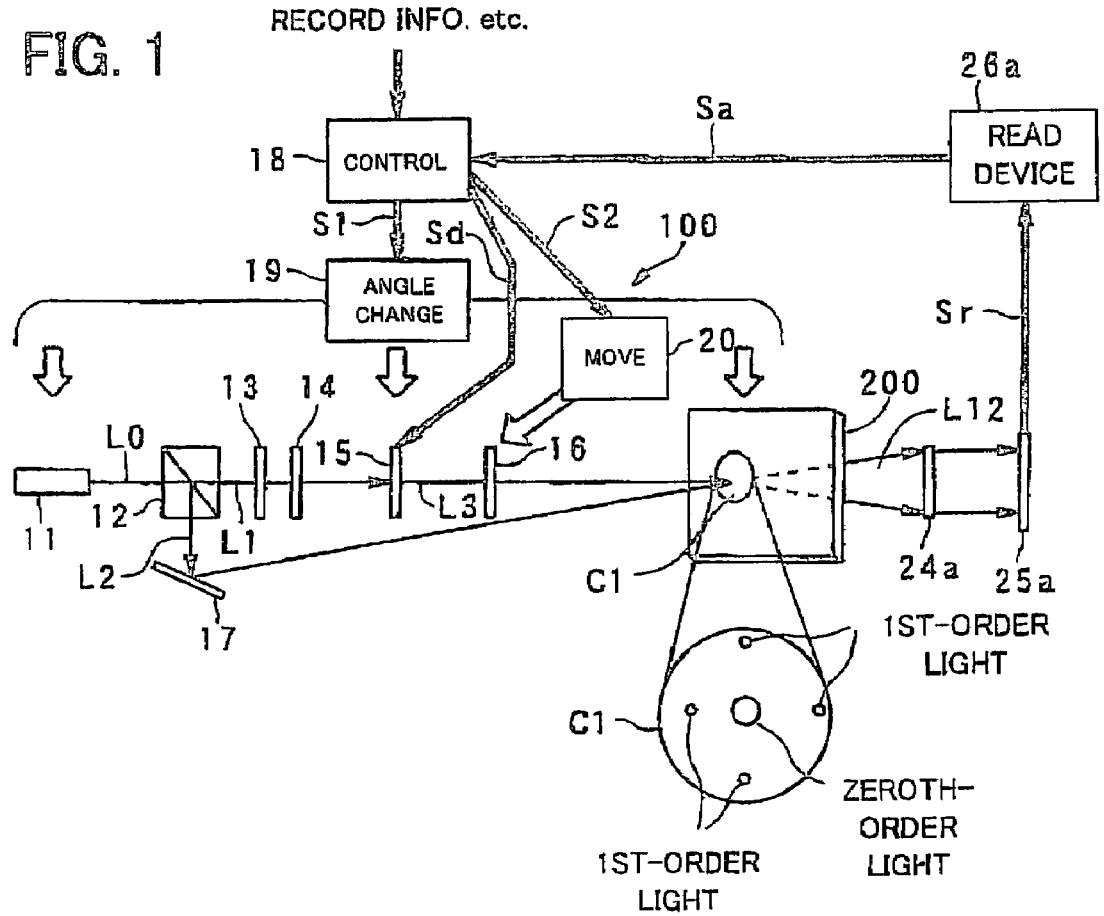
FIG. 1 is a block diagram illustrating an entire configuration of the first embodiment of the hologram record apparatus of the present invention.
Figure 2:
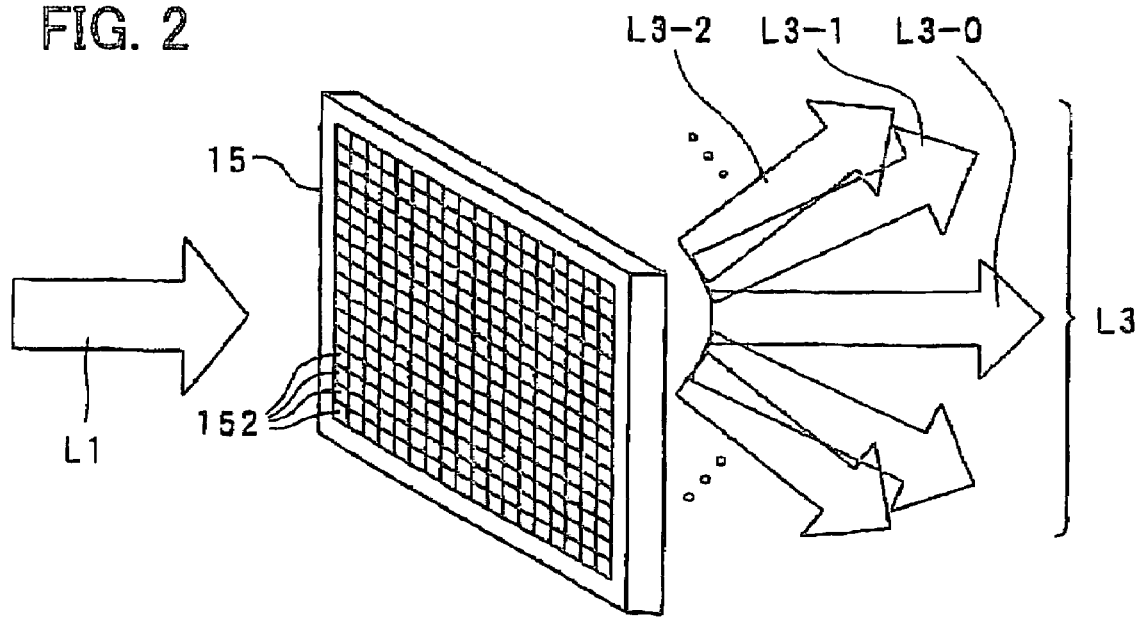
FIG. 2 is a perspective view schematically illustrating the spatial light modulator employed in the first embodiment.

Firstly, with reference to FIG. 1 and FIG. 2, the entire configuration of the hologram record apparatus of the present invention will be discussed. FIG. 1 illustrates the entire configuration of the hologram record apparatus of the present invention. FIG. 2 illustrates schematically and perspectively the spatial light modulator employed in the embodiment.

As shown in FIG. 1, the hologram record apparatus 100 in this embodiment is provided with: a laser device 11 as one example of the light source for emitting the source light L0 made of laser beam; a beam splitter 12 as one example of the optical system for splitting the source light L0 into the signal light L1 and the reference light L2; a lens 13 as one example of the enlarge optical system disposed in an optical path of the signal light L1, for enlarging a diameter of the signal light L1; a lens 14 such as a collimator lens for converting the signal light L1 outputted from the lens 13 into an approximately plane wave; a spatial light modulator 15 for modulating the signal light L1 outputted from the lens 14 in response to the recording signal to be recorded and for outputting the modulated light as the modulated signal light L3; and a lens 16 as one example of the demagnifying optical system for reducing a diameter of the signal light L3 and outputting narrowed signal light onto the hologram record medium 200.

The hologram record apparatus 100 is further provided with: a mirror 17 as one example of the optical system for introducing the reference light L2 split by the beam splitter 12 onto the hologram record medium 200, at the focus position where the signal light L3 corresponding to the reference light L2 is focused.

Incidentally, in FIG. 1, a surface part C1 of the hologram record medium 200 onto which the signal light L3 including the zeroth-order light and four 1st-order lights diffracted by the spatial light modulator 15 is focused is enlarged.

As shown in FIG. 2, the spatial light modulator 15 is made of, for example, a liquid crystal device, and divided into a plurality of cells 152. The cell 152 is the unit of the modulation. The spatial light modulator 15 can perform the modulation in each cell 152. For example, if the spatial light modulator 15 is an active matrix drive type liquid crystal device, the plurality of cells 152 is defined in response to a plurality of pixel electrodes two-dimensionally arrayed in a matrix. If the signal light L1 is introduced, the spatial light modulator 15 outputs the signal light L3 made of the modulated diffraction light including the zeroth-order diffraction light L3-0 and the higher order diffraction light such as the 1st-order diffraction light L3-1, the 2nd-order diffraction light L3-2, . . . , due to the diffraction depending on a size of the cell 152.

In FIG. 1 again, the hologram record apparatus 100 is further provided with: a record angle change device 19 for changing little by little and fixing the angles of the signal light L3 and the reference light L2 relative to the surface of the hologram record medium 200; and a control device 18 for controlling the record angle change device 19 so that the signal light L3 has the record angle corresponding to the angle record plane where the recording is performed on the hologram record medium 200. Incidentally, in this embodiment, an angle formed by an optical axis of the signal light L3 and the surface of the hologram record medium 200 is defined as a "record angle".

The record angle change device 19 has the function of changing relatively the record angle of the signal light L3 relative to the surface of the hologram record medium 200. The function can be achieved, for example, by changing the angles or positions of the constitutional elements in the optical system, such as the laser device 11; the beam splitter 12; the lenses 13, 14 and 16; and the spatial light modulator 15, relative to each light axis. Alternatively, the function can be also achieved by adding a special optical element for changing the angle of the signal light L3 or the reference light L2 to the optical system. Alternatively, the function can be achieved by mechanically changing a hold angle of the hologram record medium 200. The angle change operation of the record angle change device 19 is controlled by the control device 18 so as to be part of a series of recording operation as discussed later.

The control device 18 may include a controller comprising a microprocessor and the like, and is adapted to generate and output the control signal S1 in response to the record information and the like to be recorded onto the hologram record medium 200, control the record angle by controlling the record angle change device 19, supply the record signal Sd corresponding to the record information to the spatial light modulator 15, and control the modulation of the spatial light modulator 15.

The hologram record apparatus 100 is further provided with: a lens 24a for collecting the reproduction light L12 which is based on the reproduction illumination light and which is obtained from the hologram record medium 200; a photoreceptor 25a for receiving the reproduction light L12 via the lens 24a; and a read device 26a for reading a plurality of record information overlappingly recorded on the hologram record medium 200, on the basis of the received reproduction light L12, i.e. on the basis of the receive signal Sr outputted from the photoreceptor 25a.

In this embodiment, the reference light L2 can be directly used as the reproduction illumination light by cutting the signal light L1 or L3 before the signal light L1 or L3 reaches the hologram record medium 200. For example, the signal light L1 or L3 can be shut out by using the spatial light modulator 15 as a shutter for shutting out the signal light L1 under control of the control device 18. Alternatively, it is possible to employ an arrangement for additionally disposing a special optical element in an optical path of the signal light L1 or L3 to shut out the signal light L1 or L3, or an arrangement for selectively inserting a light shield member in an optical path of the signal light L1 or L3.

The photoreceptor 25a for receiving via the lens 24a the reproduction light L12 generated as such may include a photodiode array, a CCD (Charge Coupled Device) and the like.

The read device 26a reads each record information by identifying the record information corresponding to a light-dark pattern of the received reproduction light L12. Particularly in this embodiment, an angle standard signal Sa is written in the standard angle record plane. The angle standard signal Sa is one example of the identification information for indicating the standard angle record plane corresponding to the standard record angle from among the plurality of the angle record planes on the hologram record medium 200. The read device 26a can read the angle standard signal Sa from the standard angle record plane. The read device 26a is adapted to read the angle standard signal Sa and then output the read signal Sa to the control device 18.

Particularly in this embodiment, the control device 18 sets the record angle on recording the first angle record plane of the hologram record medium 200, as the standard record angle. After the recording is performed to the first angle record plane, the record angle change device 19 changes and fixes the record angle by a predetermined angle, based on the set standard record angle, under control of the control device 18.

Furthermore, in the case that the hologram record medium 200 is judged to be unrecorded by existence or inexistence of the angle standard signal Sa from the read device 26a, the control device 18 controls the spatial light modulator 15 so that the first angle record plane is set as the standard angle record plane, and further the angle standard signal Sa for indicating the standard angle record plane corresponding to the standard record plane is recorded to the first angle record plane. Then, on the basis of the angle standard signal Sa, it can be readily recognized that the standard record angle is already set to the hologram record medium 200. Furthermore, by using the read device 26a, it is readily identified which angle record plane is the standard angle record plane, regardless whether the hologram record medium 200 to be used for the recording is the same or different, or whether the hologram record apparatus 100 to be used for the recording is the same or different.

Furthermore, with regard to the hologram record medium 200 after the record information is recorded onto the first angle record plane, the control device 18 calibrates the record angle change device 19 on the basis of the standard record angle indicated by the angle standard signal Sa. That is, when the first angle record plane is recorded, the first angle record plane is set as the standard angle record plane and the record angle change device 19 is not calibrated. Then, when any other angle record plane is recorded, the record angle change device 19 is calibrated, in response to the standard record angle corresponding to the standard angle record plane indicated by the angle standard signal Sa. More specifically, for example, a difference between the standard record angle corresponding to the standard angle record plane indicated by the angle standard signal Sa and the record angle under a setting condition of the optical system or mechanical state expected to correspond to the standard record angle in the record angle change device 19 at the time point of presently recording is detected. Furthermore, the record angle change device 19 is adapted to change the record angle by offsetting the detected difference of angle.

Furthermore, also in the case that the angle standard signal Sa is recorded onto the hologram record medium 200 by another hologram record apparatus from the first, the control device 18 is adapted to calibrate the record angle change device 19 on the basis of the standard record angle indicated by the angle standard signal Sa.

Additionally, the hologram record apparatus 100 is further provided with a move device 20 for moving the focus position where the signal light L3 and the standard light L2 are collected relative to the surface of the hologram record medium 200, in a direction along the surface. The move device 20 may move the focus position of the signal light L3 and the standard light L2 by changing the angle or position of the optical system such as the lens 16. Alternatively, it may move the focus position by changing the angle or position of another optical system such as the laser device 11, or by additionally disposing a special optical system (e.g. a mirror having variable dispose angles) in optical paths of the signal light L1 or L3 and the reference light L2. Furthermore, it may include a hologram record medium holding mechanism to move the hologram record medium 200 itself mechanically in a direction along its surface. The moving by the move device 20 is also controlled by the control signal S2 generated at and outputted from the control device 18, so that the moving is a part of a series of recording as mentioned later.

Particularly in this embodiment, the record angle change device 19 is one example of the "parameter set device" of the present invention and can change the record angle as one example of the parameter for multiple recordings. On the other hand, the move device 20 is one example of the "move device" of the present invention. Then, when the move device 20 moves the record area, under control of the control device 18, the move device 20 uses the record angle, which was used for the last recording to the recording area before moving, as the record angle for the first recording to the record area after moving. The control for the record angle change device 19 and the move device 20 by the control device 18 will be discussed later (see FIG. 3 and FIG. 4).

Next, with reference to FIG. 1, the fundamental recording of the hologram record apparatus 100 in this embodiment configured as mentioned above is explained.

During its operation, the laser device 11 emits the source light L0, the beam splitter 12 splits the source light L0 into the signal light L1 and the reference light L2. Then, the signal light L1 is regulated into a diameter matched with a size of the spatial light modulator 15 via the lenses 13 and 14, and introduced into the spatial light modulator 15. Then, the spatial light modulator 15, under control of the control device 18, modulates the signal light L1 by a modulation unit of each cell 152, in response to each of a plurality of record information to be recorded. Then, the modulated signal light L3 is collected by the lens 16. Then, the record area of the hologram record medium 200 is irradiated with the modulated and collected signal light L3 and the reference light L2 reflected at the mirror 17. Then, these lights interfere with each other, so that the record information to be recorded is holographically recorded as a wavefront.

Due to the fundamental recording as mentioned above, the record information is recorded to one angle record plane for one record angle in one record area which is irradiated with the signal light L3 and the reference light L2 at the same time.

Figure 3:
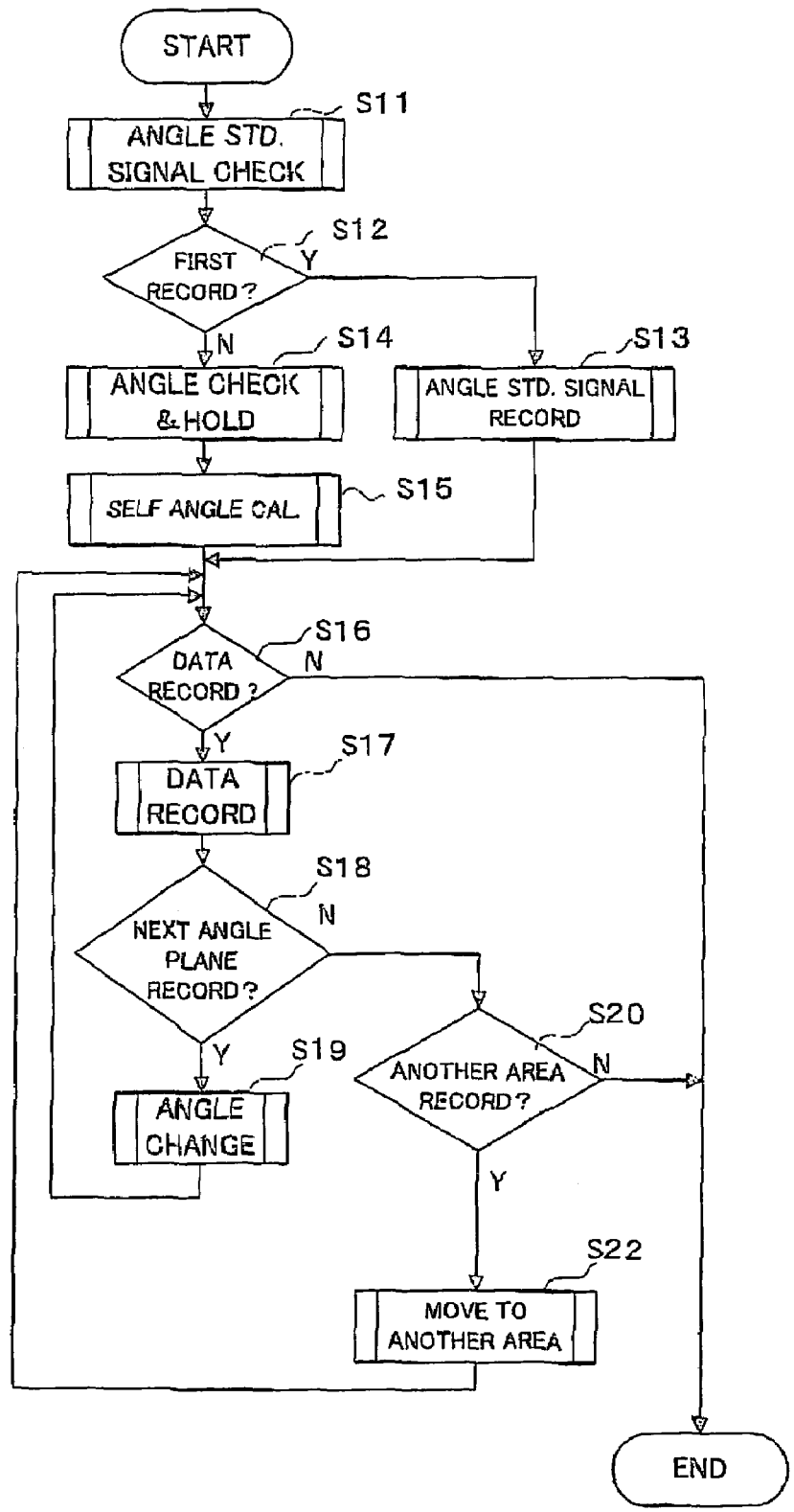
FIG. 3 is a flow chart illustrating an operational flow of the angle-multiplex type recording in the first embodiment.
Figure 4:
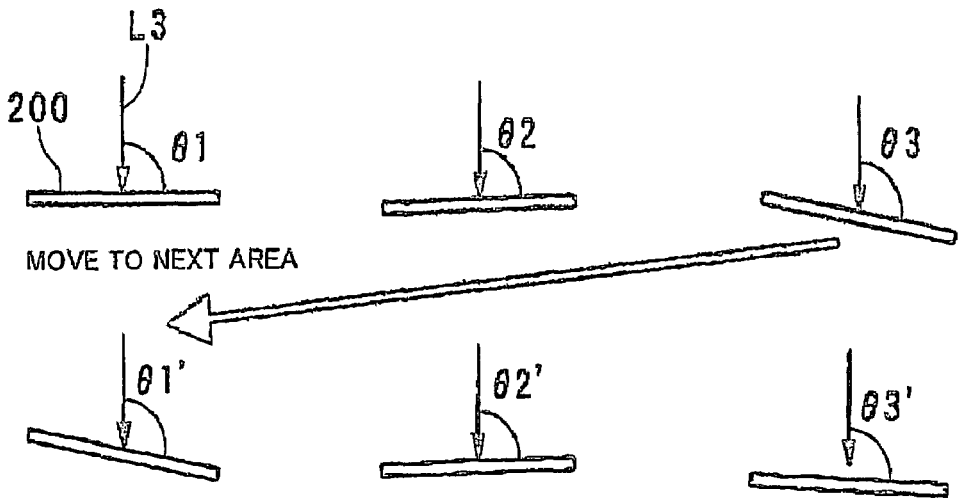
FIG. 4 is a conceptual view illustrating, in the upper part, the change of the record angle in one record area before the moving, and in the lower part, the record angle in another record area after the moving.

Next, angle-multiplex type recording with the hologram record apparatus 100 in this embodiment for performing the aforementioned fundamental recording to a plurality of angle record planes and further to a plurality of record areas is explained, with reference to FIG. 3 and FIG. 4. FIG. 3 illustrates an operational flow of the recording. FIG. 4 illustrates, in its upper part, the change of the record angle in one record area before the moving, and in its lower part, the change of the record angle of another record area after the moving.

In FIG. 3, firstly the signal light L3 is shut out and the reference light L2 is used as the reproduction illumination light, and then the reproduction light L12 is received at the photoreceptor 25*a*. In response to this, the angle standard signal Sa outputted from the read device 26*a* is checked by the control device 18 (step S11). Then, depending on the existence or inexistence of the angle standard signal Sa, whether or not it is the first recording relative to the hologram record medium 200 is judged by the control device 18 (step S12).

At this stage, if it is the first recording (step S12: Yes), the signal light L3 and the reference light L2 are used, and the modulation is performed by the spatial light modulator 15 on the basis of the record signal Sd indicating the angle standard signal Sa so that the angle standard signal Sa is recorded. Since the angle record plane is the standard record plane at this time, the recording is performed to the standard record plane of the hologram record medium 200 (step S13).

On the other hand, as the result of the judgment at step S12, if it is not the first recording (step S12: No), the current record angle fixed by the record angle change device 19 is checked, and it is recorded into for example a built-in memory of the control device 18 (step S14). Furthermore, the record angle change device 19 is calibrated on the basis of difference between the standard record angle corresponding to the standard angle record plane indicated by the angle standard signal Sa and the current record angle under the fixed state (step S15). This calibration is performed, for example, by offsetting the aforementioned difference of angle in the control signal S1 that is inputted into the record angle change device 19.

Next to processes at steps S13 and S15, the control device 18 judges whether or not the data recording of the record information is to be performed to the current angle record plane fixed by the record angle change device 19 in the current record area (i.e. an area irradiated with the signal light L3 and the reference light L2 at this time) of the hologram record medium 200 fixed by the more device 20 (step S16).

If the data recording is not to be performed (step S16: No), the process flow ends. That is, in this case, it can be said that checking the angle standard signal Sa (step S11), recording the angle standard signal Sa (step S13) and so on are effectively performed.

On the other hand, as the result of the judgment at step S16, if the data recording is to be performed (step S16: Yes), the irradiation with the signal light L3 and the reference light L2 is performed and the signal light L3 is modulated by the spatial light modulator in response to the record signal Sd, so that the data recording is actually performed (step S17).

Next, the control device 18 judges whether or not the data recording of the record information is to be performed to the next angle record plane changeable by the record angle change device 19 in the current record area of the hologram record medium 200 fixed by the move device 20 (step S18).

If the data recording is to be performed to the next angle record plane (step S18: Yes), the record angle change device 19 changes the record angle by a predetermined fine angle (e.g. 0.01 degree) under control of the control signal S1 (step S19). In this case, as mentioned above, since the record angle change device 19 is calibrated on the basis of the standard record angle, it is possible to change accurately the record angle. Then, the process flow goes back to step S16 and then repeats the processes after step S16.

On the other hand, as the result of the judgment at step S18, if the data recording is not to be performed to the next record plane (step S18: No), the control device 18 judges whether or not the data recording of the record information is to be performed to another record area changeable by the move device 20 (step S20).

If the data recording is to be performed to another record area (step S20: Yes), the move device 20 moves the area, which is irradiated with the signal light L3 and the reference light L2, by a predetermined distance under control of the control signal S2, to be another record area (step S22). Then, the process flow goes back to step S16, and then repeats the processes after step S16.

On the other hand, as the result of the judgment at step S20, if the data recording is not to be performed to another record area (step S20; No), a series of recording operations ends.

Thus, the multiple recordings of the record information to a plurality of angle record planes in a plurality of record areas complete.

Particularly in this embodiment, at the aforementioned step S22, when the move device 20 moves the record area, under control of the control device 18, the record angle, which was used for the last recording to the record area before moving, is used as the record angle for the first recording to the record area after moving, i.e. the standard record angle in relation to the record area after moving.

More specifically, as shown in FIG. 4, in the case of recording to one record area indicated in the upper part of the figure, the record angle of the first angle record plane is firstly set as θ1 on the first recording. On the second recording following after this, the record angle of the second angle record plane is set as 0 2. On the third recording following after this, the record angle of the third angle record plane is set as θ3. After these three recordings to said one record area end, the move device 20 moves the record area. Then, in the case of recording to another record area shown in the lower part of the figure, the record angle of the first angle record plane is firstly set as 0 1' on the first recording. On the second recording following after this, the record angle of the second angle record plane is set as θ2'. On the third recording further following to this, the record angle of the third angle record plane is set as θ3'. After these three recordings to another record area end, the move device 20 moves the record area.

When the record area is changed as such, the first record angle θ1' to the after-moving record area is set to be equal to the last record angle θ3 in the before-moving record area, without resetting the record angle.

Therefore, the quick recording is performable, after the record area is changed, in comparison with the case that the record angle change device 19 resets the record angle and changes the record angle from the after-reset standard record angle.

Furthermore in this embodiment, the record angle changed by the record angle change device 19 into the order (see the upper part of FIG. 4) from the first to n-th (n is natural number not less than 2) on recording before the moving is changed into the upside down order (see the lower part of FIG. 4) on recording after the moving. Therefore, changing the record angle becomes easy to control.

Additionally, preferably in this embodiment, the rule about the record order of a plurality of record areas and the record order of a plurality of angle record planes in each record area is set in advance, and the recording is always performed according to this rule. Thereby, it becomes unnecessary to record and read the information for indicating the standard record angle in each record area or the information for indicating the record order onto or from the hologram record medium 200.

In this embodiment, as mentioned above, the angle-multiplex system remarkably increases the record density and the record capacity, and makes it possible to perform the quick recording.

As explained above, the hologram record apparatus 100 in this embodiment can perform the angle-multiplex type hologram record. In this embodiment, however, any record information multiply recorded onto the hologram record medium 200 in the angle-multiplex system can be reproduced using the lens 24a, the photoreceptor 25 and the read device 26a, by shutting out the signal light L1 or L3 and by using the reference light L2 as the reproduction illumination light. That is, in the configuration of the first embodiment shown in FIG. 1, if, on recording and on reproduction, the signal L1 or L3 is shut out, and the reproduction operation the same as the hologram reproduction apparatus mentioned later is performed by the lens 24, the photoreceptor 25a, the read device 26a and the control device 18, the hologram record apparatus 100 in this embodiment can be configured as the hologram record and reproduction apparatus capable of performing the recording and reproduction.

In the embodiment mentioned above, the spatial light modulator 15 may binarily modulate the signal light L3 in response to binary data indicated by the record information, or may multilevel-modulate the signal light L3 in response to gray scale data indicated by the record information.

Incidentally, a material for the hologram record medium may be a known inorganic material or organic material (polymer material). Furthermore, the hologram record medium may be in a form of card-like medium, or a disc-like medium.

Second Embodiment of Hologram Record Apparatus

Figure 5:
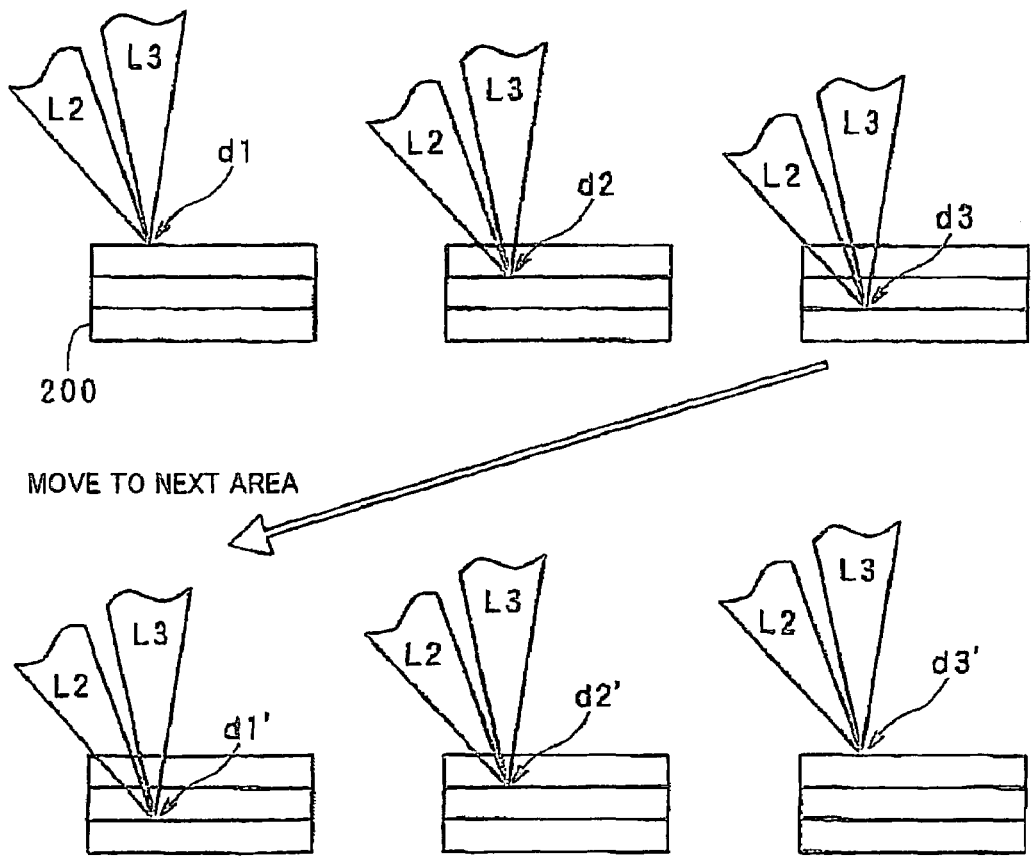
FIG. 5 is a conceptual view illustrating, in the upper part, the change of the focal depth in one record area before the moving, and in the lower part, the focal depth in another record area after the moving, in the second embodiment of the hologram record apparatus of the present invention.

The second embodiment of the hologram record apparatus of the present invention is explained with reference to FIG. 5. FIG. 5 conceptually illustrates, in its upper part, the change of the focal depth in one record area before the moving, and in its lower part, the change of the focal depth in another record area after the moving.

In the second embodiment, different from the first embodiment, provide with the focal-depth-multiplex system, instead of the angle-multiplex system. More specifically, the hologram record apparatus in the second embodiment is provided with a focal depth change device instead of the record angle change device 19. The focal depth change device is another example of the "parameter set device" of the present invention. The focal depth change device has the function of relatively changing the focal depths of the signal light L3 and the reference light L2 relative to the surface of the hologram record medium 200. The function can be achieved, for example, by changing the angles or positions of the constitutional element in the optical system, such as the laser device 11, the beam splitter 12, the lenses 13, 14 and 16, and the spatial light modulator 15 relative to each optical axis. Alternatively, the function can be achieved by adding a special optical system for changing the focal depth of the signal light L3 or the reference light L2 to the optical system. Alternatively, the function can be achieved by mechanically moving a hold position of the hologram record medium 200 relative to the optical axis. Other parts of the configuration are the same as those of the first embodiment mentioned above.

In the second embodiment, when the move device 20 moves the record area and the recording is performed, the focal depth, which was used for the last recording to the record area before the moving, is used as the focal depth for the first recording to the record area after the moving, i.e. the standard focal depth to the after-moving record area.

More specifically, as shown in FIG. 5, in the case of recording relative to one record area shown in the upper part of the figure, the focal depth of the first focal depth plane is firstly set as d1 (e.g. d1=0, i.e. this focal depth d1 becomes the standard focal depth). On the second recording following after this, the focal depth of the second focal depth plane is set as d2. On the third recording further following after this, the focal depth of the third focal depth plane is set as d3. After these three recordings to said one record area end, the move device 20 moves the record area. Then, in the case of recording to another record area shown in the lower part of the figure, on the first recording, the focal depth of the first focal depth plane is firstly set as d1'. On the second recording following after this, the focal depth of the second focal depth plane is set as d2'. On the third recording further following after this, the focal depth of the third focal depth plane is set as d3'. After these three recordings end, the move device 20 moves the record area.

When the record area is changed as such, the first focal depth d1' in the after-moving record area is set to be equal to the last focal depth d3 in the before-moving record area, without resetting the focal depth.

Therefore, the quick recording is performable, after the record area is changed, in comparison with the case that the focal depth change device resets the focal depth and changes the focal depth from the after-reset standard focal depth.

(Modifications of Hologram Record Apparatus)

Incidentally, in the aforementioned embodiments, reference light phase-code-multiplex system to perform the multiple recordings with various phases of the reference light L2 may be employed instead of or in addition to the angle-multiplex system or focal-depth-multiplex system in the aforementioned embodiments. In this case, for example, the optical element for phase polarization may be disposed in the optical path of the reference light L2 so that the phase of the reference light L2 is changed, and then the hologram recording similar to the aforementioned case can be performed, in an overlapping manner, to the same record area for each phase.

Furthermore, in the aforementioned embodiments, the reference light amplitude-multiplex system can be employed to perform the multiple recordings with the amplitude of the reference light L2 being changed, instead of or in addition to the angle-multiplex system or the focal-depth-multiplex system in the aforementioned embodiments. In this case, for example, the optical element for changing the amplitude may be disposed in the optical path of the reference light L2 so that the amplitude of the reference light L2 is changed, and the hologram recording can be performed, similarly to the aforementioned case, to the same record area for each amplitude.

Furthermore, in the aforementioned embodiments, the reference light polarization-multiplex system may be employed instead of or in addition to the angle-multiplex system or the focal-depth-multiplex system in the aforementioned embodiment.

In these modifications, in comparison with the aforementioned embodiments, a further high density hologram recording is presented.

Embodiment of Hologram Reproduction Apparatus

Embodiments of the hologram reproduction apparatus of the present invention are explained with reference to FIG. 6 and FIG. 7.

Figure 6:
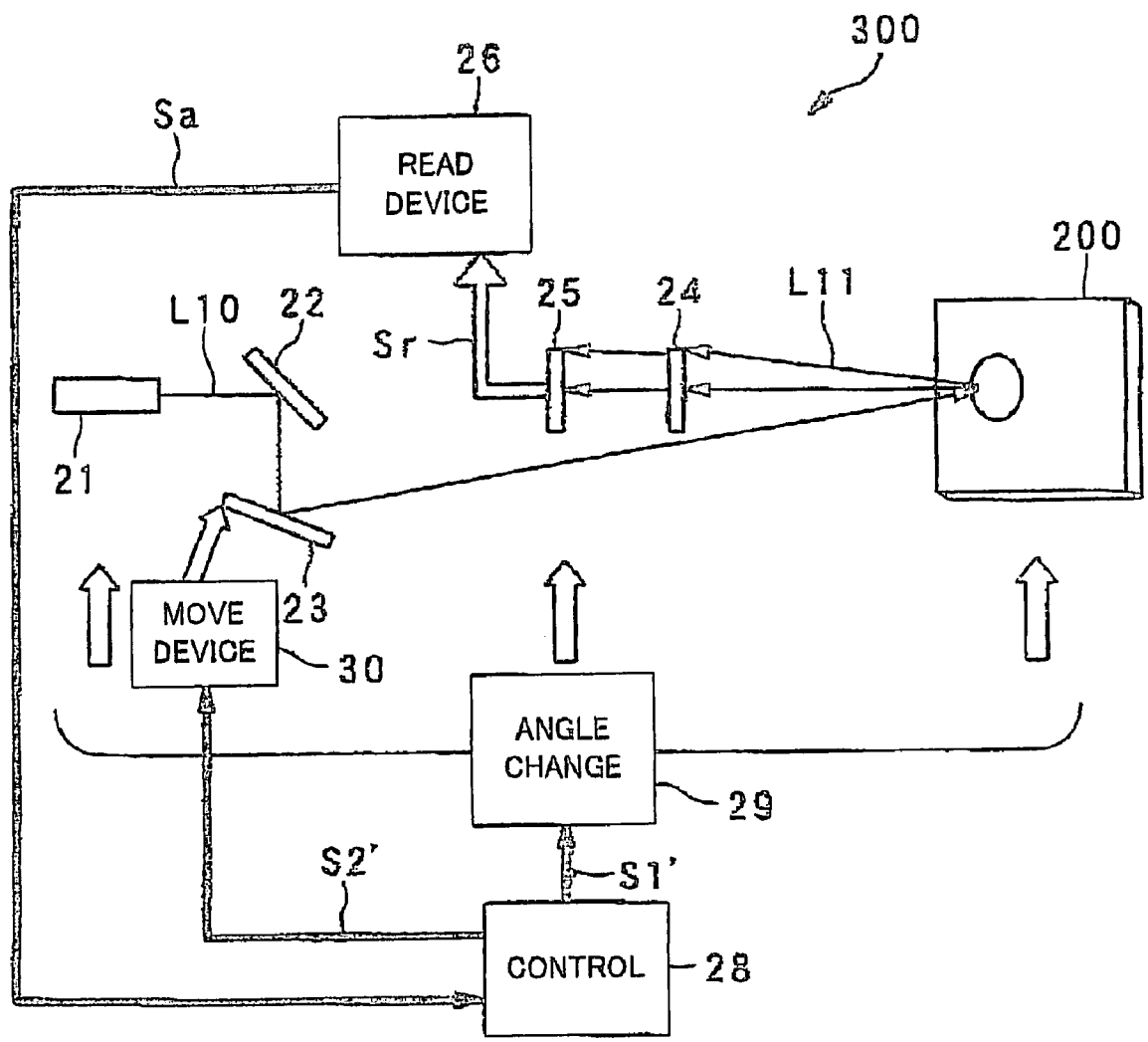
FIG. 6 is a block diagram illustrating an entire configuration of the hologram reproduction apparatus in an embodiment of the present invention.

Firstly, with reference to FIG. 6, the entire configuration of the hologram reproduction apparatus in this embodiment is explained. FIG. 6 illustrates the entire configuration of the hologram reproduction apparatus in this embodiment.

The hologram reproduction apparatus 300 in this embodiment is for reading the record information from the hologram record medium 200 recorded by the hologram record apparatus 100 in the aforementioned embodiments.

As shown in FIG. 6, the hologram reproduction apparatus 300 is provided with: a laser device 21 as an example of the light source such as a semiconductor laser for irradiating reproduction illumination light L10 onto the hologram reproduction medium 200; mirrors 22 and 23 for introducing the reproduction illumination light L10 to the hologram record medium 200; a lens 24 for collecting reproduction light L11 based on the reproduction illumination light; a photoreceptor 25 for receiving the reproduction light L11 via the lens 24; a read device 26 for reading the record information recorded onto the hologram record medium 200 on the basis of the received signal Sr outputted from the photoreceptor 25 in response to the received reproduction light L11.

The hologram reproduction apparatus 300 is further provided with: a reproduction angle change device 29 for changing little by little and fixing the angles of the reproduction illumination light L10 relative to the surface of the hologram record medium 200; and a control device 28 for controlling the reproduction angle change device 29 so that the reproduction illumination light L10 has the reproduction angle corresponding to the angle record plane where the reproduction is performed on the hologram record medium 200. Incidentally, in this embodiment, an angle formed by an optical axis of the reproduction illumination light L10 and the surface of the hologram record medium 200 is defined as a "reproduction angle".

The reproduction angle change device 29 has the function of changing relatively the reproduction angle of the reproduction illumination light L10 relative to the surface of the hologram record medium 200. The function can be achieved, for example, by changing the angles or positions of the constitutional elements in the optical system, such as the laser device 21; the mirrors 22 and 23, relative to each optical axis. Alternatively, the function can be achieved by adding a special optical element for changing the angle of the reproduction illumination light L10 to this optical system. Alternatively, the function can be achieved by mechanically changing a hold angle of the hologram record medium 200. The angle change operation of the reproduction angle change device 29 is controlled by the control device 28, so that it becomes a part of a series of reproduction as discussed later.

The control device 28 may include a controller comprising a microprocessor and the like, and is adapted to generate and output the control signal S1' in response to the record information and the like to be reproduced from the hologram record medium 200, and control the reproduction angle with the reproduction angle change device 29.

The photoreceptor 25 for receiving the reproduction light L11 generated as such via the lens 24 may include the photodiode array, the CCD and so on.

The read device 26 preferably stores into the memory a table of relationship between the light-dark pattern received at the photoreceptor 25 and a plurality of record information values modulated by a cell unit by the spatial light modulator 15 (see FIG. 1) when recording the hologram record medium 200. Then, each record information is read by identifying the light-dark pattern of the received reproduction light L11 and by identifying the record information corresponding to the identified light-dark pattern with reference to this table. Therefore, a plurality of record information recorded on one angle record plane in one record area can be read at the same time.

Particularly in this embodiment, the read device 26 can read the angle standard signal Sa from the standard angle record plane where the angle standard signal Sa is written from among a plurality of angle record planes on the hologram record medium 200. Then, after reading the angle standard signal Sa, the read device 26 outputs it to the control device 28.

The control device 28 can readily identify which angle record plane is the standard record plane on the basis of the angle standard signal Sa, regardless of whether the hologram record medium 200 to be used for the reproduction is the same or different, or whether the hologram reproduction apparatus 300 to be used for the reproduction is the same or different.

Furthermore, the control device 28 calibrates the reproduction angle change device 29 on the basis of the standard record angle indicated by the angle standard signal Sa. That is, on reproduction any angle record plane, the reproduction angle change device 29 is firstly calibrated in response to the standard reproduction angle corresponding to the standard angle record plane indicated by the angle standard signal Sa. More specifically, for example, a difference between the standard reproduction angle corresponding to the standard angle record plane indicated by the angle standard signal Sa and the reproduction angle under a setting condition of the optical system or mechanical state expected to correspond to the standard reproduction angle in the reproduction angle change device 29 at the time point of presently reproduction is detected. Furthermore, the reproduction angle change device 29 is adapted to change the reproduction angle by offsetting the detected difference of angle.

Additionally, the hologram reproduction apparatus 300 is further provided with; a move apparatus 80 for moving the focus position where the reproduction illumination light L10 is collected relative to the surface of the hologram record medium 200 in a direction along its surface.

The move device 30 may move the focus position of the reproduction illumination light L10 by changing the angle or position of the optical system such as the mirrors 22 and 23, for example. Alternatively, the focus position may be moved by changing the angle or position of another optical system such as the laser device 21, or by additionally disposing a special optical system (e.g. a mirror having a variable set angle) in an optical path of the reproduction illumination light L10. Furthermore, a hold mechanism for holding the hologram record medium 200 may be employed to move the hologram record medium 200 itself mechanically in a direction along its surface. Also the moving by the move device 30 is controlled by the control signal S2' generated at and outputted from the control device 28, so that it becomes a part of a series of reproduction operations mentioned later.

Particularly in this embodiment, the reproduction angle change device 29 is another example of the "parameter set device" of the present invention and can change the reproduction angle as an example of the parameter for multiple recordings. On the other hand, the move device 30 is an example of the "move device" of the present invention. Then, when the move device 30 moves the record area and the reproduction is performed, under control of the control device 28, the reproduction angle, which was used at the last reproduction to the record area before moving, is directly used as the reproduction angle for the first reproduction to the record area after moving.

Figure 7:
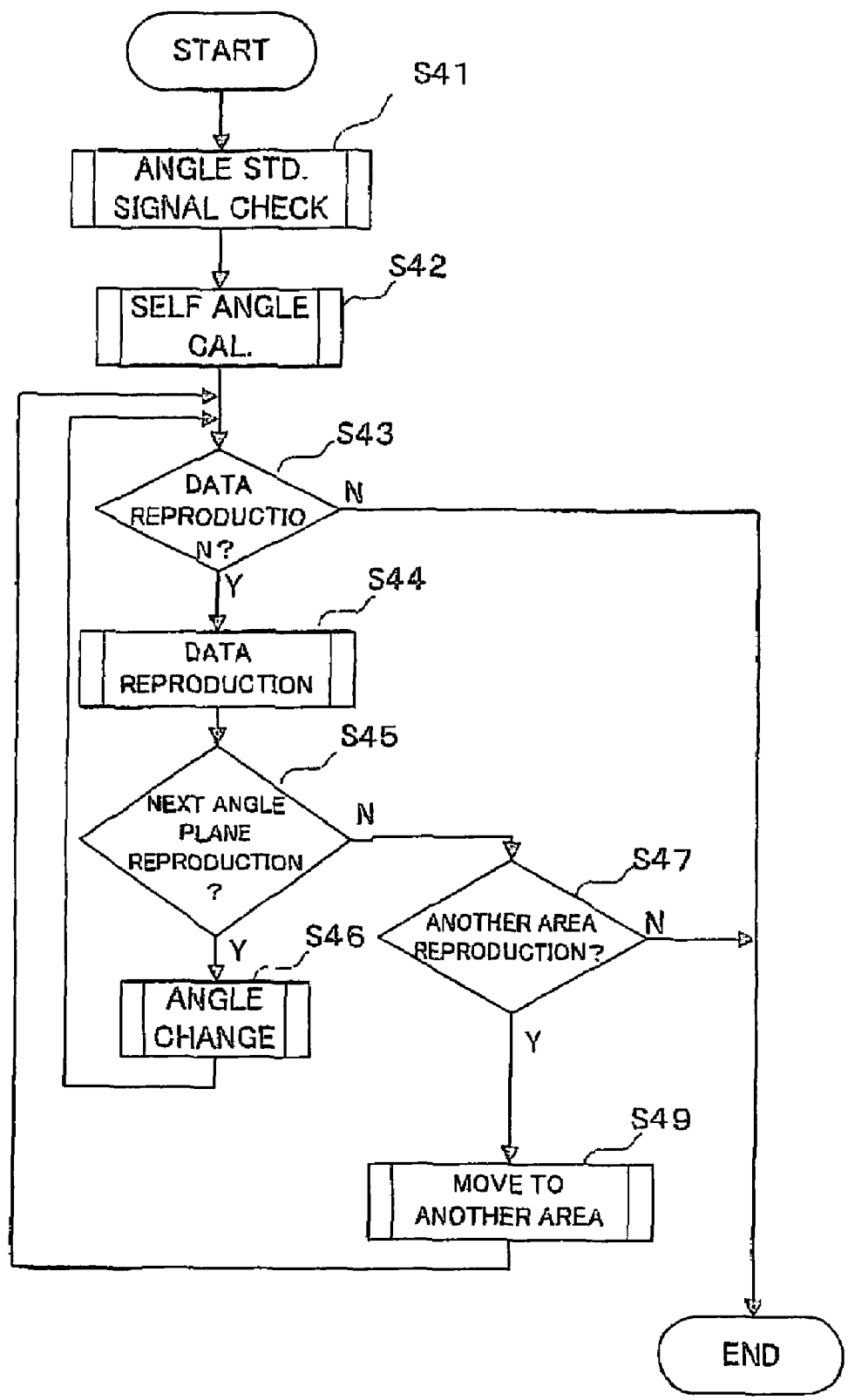
FIG. 7 is a flow chart illustrating an operational flow of the angle-multiplex type reproduction in the embodiment of the hologram reproduction apparatus of the present invention.

Next, with reference to FIG. 7, the fundamental reproduction of the hologram reproduction apparatus 300 in this embodiment configured as such is explained.

During its operation, the laser device 21 irradiates the hologram record medium 200 with the reproduction illumination light L10 via the mirrors 22 and 23. Then, the photoreceptor 25 receives the reproduction light L11 based on the reproduction illumination light L10 for the hologram record medium 200. The reproduction light L11 may be the zeroth-order light or the higher order light such as the 1st-order light generated when the hologram record medium 200 is irradiated with the reproduction illumination light L10 corresponding to the reference light of recording. Due to the property of the hologram recording, the reproduction light L11 has the light-dark pattern the same as that of the modulated signal light L3 shown in FIG. 1.

Next, on the basis of the reproduction light L11 received at the photoreceptor 25, each record information recorded onto the hologram record medium 200 subjected to the high density recording as mentioned above is reproduced by the read device 26.

Owing to the fundamental reproduction, the record information to one angle record plane for one reproduction angle in one record area irradiated with the reproduction illumination light L10 at one time is reproduced.

Next, the angle-multiplex type reproduction in the hologram reproduction apparatus 300 in this embodiment, in which the fundamental reproduction is performed to a plurality of angle record planes and further a plurality of record areas, is discussed in detail with reference to FIG. 7. FIG. 7 illustrates an operational flow of the reproduction.

In FIG. 7, the reproduction light L11 based on the reproduction illumination light L10 is firstly received at the photoreceptor 25. In response to this, the angle standard signal Sa outputted from the read device 26 is checked by the control device 28 (step S41). Then, the reproduction angle change device 29 is calibrated on the basis of the difference between the current reproduction angle fixed by the reproduction angle change device 29 and the standard reproduction angle corresponding to the standard angle record plane indicated by the angle standard signal Sa (step S42). This calibration is performed by offsetting the aforementioned difference of angle in the control signal S1' that may be inputted into the reproduction angle change device 29.

Next, the control device 28 judges whether or not the data reproduction is to be performed to the current angle record plane fixed by the reproduction angle change apparatus 29 in the current record area of the hologram record medium 200 fixed by the move device 30 (step S43).

If the data reproduction is not to be performed (step S43. No), the process flow ends. That is, in this case, it can be said that checking the angle standard signal Sa (step S41) and so on is effectively performed.

On the other hand, as the result of the judgment at step S43, if the data reproduction is to be performed (step S43: yes), the irradiation with the reproduction illumination light L10 is performed, and the photoreceptor 25, the read device 26 and the like perform actually the data reproduction (step S44).

Next, the control device 28 judges whether or not the data reproduction of the record information is to be performed to the next angle record plane changeable by the reproduction angle change apparatus 29 in the current record area of the hologram record medium 200 fixed by the move device 30 (step S45).

If the data reproduction is to be performed to the next angle record plane (step S45: Yes), the reproduction angle change device 29 changes the reproduction angle by a predetermined fine angle (e.g. 0.01 degree) under control of the control signal S1' (step S46). In this case, as mentioned above, since the reproduction angle change device 29 is calibrated on the basis of the standard reproduction angle, it is possible to change accurately the reproduction angle. Then, the process flow goes back to step S43 to repeat the following processings.

On the other hand, as the result of the judgment at step S45, if the data reproduction is not to be performed to the next angle record plane (step S45: No), the control device 28 judges whether or not the data reproduction of the record information is to be performed to another record area changeable by the move device 30 (step S47).

If the data reproduction is to be performed to another record area (step S47: Yes), the move device 30 moves the area irradiated with the reproduction illumination light L10 by a predetermined distance under control of the control signal S2' to become another record area (step S49). Then, the process flow goes back to step S16 to repeat the following processings.

On the other hand, as the result of the judgment at step S47, if the data reproduction is not to be performed to another record area (step S47: No), a series of reproduction processings ends.

Thus, the reproductions of the record information to a plurality of angle record planes in a plurality of record areas complete.

Particularly in this embodiment, in the aforementioned step S47, when the move device 30 moves the record area under control of the control device 28 and the reproduction is performed, the reproduction angle, which was used for the last reproduction to the record area before the moving, is directly used as the reproduction angle for the first reproduction to the record area after the moving, i.e. the standard reproduction angle to the after-moving record area.

Therefore, the quick reproduction is performable, after the record area is moved, in comparison with the case that the reproduction angle change device 29 resets the reproduction angle and changes the reproduction angle from the after-reset standard reproduction angle.

Furthermore in this embodiment, the reproduction angle changed by the reproduction angle change device 29 into the order from the first to n-th (n is natural number not less than 2) on recording before the moving is changed into the upside down order (see the lower part of FIG. 4) on recording after the moving. Therefore, changing the reproduction angle becomes easy to control.

In this embodiment, as mentioned above, the angle-multiplex system can remarkably increase the record density and the record capacity, and makes it possible to perform the quick reproduction.

For example, in the case that the information is multiply recorded with the record angle θ0, θ1, θ2 and the focal depth d0, d1, d2, it is possible to employ a hierarchical record procedure in which (1) firstly the record angle is set as θ0, and then the focal depth is changed in the order of d0, d1, d2 to perform the recordings, (2) the record angle is then changed to θ1 and then the focal depth is changed in the order of d2, d1, d0 to perform the recordings, (3) the record angle is then changed to θ2 and then the focal depth is changed in the order of d0, d1, d2 to perform the recordings, (4) the record angle is then changed to θ1, and then the focal depth is changed in the order of d2, d1, d0 to perform the recordings, and (5) the record angle is then changed to θ0 and then the focal depth is changed in the order of d0, d1, d2 to perform the recording. Alternatively, similarly to this, it is possible to employ a hierarchical reproduction procedure. Also in this case, an effect similar to the aforementioned embodiments can be obtained in which the focal depth does not need to be reset at every time when the record angle or the reproduction angle is changed.

As discussed above, according to the hologram record apparatus and method, as well as the hologram reproduction apparatus and method, of the present invention, it is possible to improve the record density and the record capacity, and further to perform the recording or the reproduction accurately and quickly.

The present invention is not limited to the aforementioned embodiments, and may be modified within a range not departing from the essence or spirit of the invention read from the whole specification and the claims. Such a modified hologram record apparatus and method, as well as such a modified hologram reproduction apparatus and method, are all encompassed within a technical scope of the present invention.

INDUSTRIAL APPLICABILITY

The hologram record apparatus and method, as well as the hologram reproduction apparatus and method, according to the present invention are applicable to various record apparatus and method for recording, with high density, various contents information such as video information and audio information, various data information for computers, a large volume of information such as control information, by irradiating a downsizable hologram record medium with signal light, or also applicable to various reproduction apparatus and method for reproducing the large volume of information recorded with high density from a downsizable hologram record medium, by irradiating the downsizable hologram record medium with the reproduction light.

The invention claimed is:

1. A multiple record type hologram record apparatus comprising:
    a light source for performing an irradiation with source light including signal light and reference light;
    a spatial light modulator disposed in an optical path of the signal light and capable of modulating the signal light;
    an optical system for introducing the signal light after passed through said spatial light modulator and the reference light onto a hologram record medium;
    a move device for moving a focus position of the signal light and the reference light introduced by said optical system, relative to the hologram record medium in a direction along a surface of the hologram record medium;
    a parameter set device capable of changing and fixing a predetermined kind of parameter for multiple recording for at least one of the signal light and the reference light; and
    a control device for controlling said parameter set device to perform a recording by using the parameter used for the last recording at the m-th focus position, m is a natural number, as the parameter for the first recording at the (m+1)-th focus position.

2. The multiple record type hologram record apparatus according to claim 1, wherein
    said control device controls said parameter set device to change the parameter in an order from the first to the n-th, n is a natural number not less than 2, on the recording at the m-th focus position and change the parameter in an upside down order on the recording at the (m+1)-th focus position.

3. The multiple record type hologram record apparatus according to claim 1, wherein
    said parameter set device includes at least one of: a device for changing and fixing an incident angle of the signal light entering the hologram record medium; a device for changing and fixing a focal depth of the signal light entering the hologram record device; a device for changing and fixing a phase of the reference light; a device for changing and fixing an amplitude of the reference light; and a device for changing and fixing polarization of the reference light.

4. A multiple record type hologram reproduction apparatus comprising:
- a light source for irradiating a multiple record type hologram record medium with reproduction illumination light;
- a photoreceptor for receiving reproduction light based on the reproduction illumination light from the hologram record medium;
- a read device for reading record information recorded on the hologram record medium on the basis of the received reproduction light;
- a move device for moving a focus position of the reproduction illumination light relative to the hologram record medium in a direction along a surface of the hologram record medium;
- a parameter set device capable of changing and fixing a predetermined kind of parameter for multiple recording relating to the reproduction illumination light; and
- a control device for controlling said parameter set device to perform a reproduction by using the parameter used at the last reproduction at the m-th focus position, m is a natural number, as the parameter for the first reproduction at the (m+1)-th focus position.

5. The multiple record type hologram reproduction apparatus according to claim 4, wherein
said control device controls said parameter set device to change the parameter in an order from the first to the n-th, n is a natural number not less than 2, on the reproduction at the m-th focus position and change the parameter in an upside down order on the reproduction at the (m+1)-th focus position.

6. The multiple record type hologram reproduction apparatus according to claim 4, wherein
said parameter set device includes at least one of: a device for changing and fixing an incident angle of the reproduction illumination light entering the hologram record medium; a device for changing and fixing a focal depth of the reproduction illumination light entering the hologram record device; a device for changing and fixing a phase of the reproduction illumination light; a device for changing and fixing an amplitude of the reproduction illumination light; and a device for changing and fixing polarization of the reproduction illumination light.

7. A multiple record type hologram record method of recording information to a hologram record medium in a multiple record type hologram record apparatus comprising: a light source for performing an irradiation with source light including signal light and reference light; a spatial light modulator disposed in an optical path of the signal light and capable of modulating the signal light; an optical system for introducing the signal light after passed through said spatial light modulator and the reference light onto the hologram record medium; a move device for moving a focus position of the signal light and the reference light introduced by said optical system, relative to the hologram record medium in a direction along a surface of the hologram record medium; and a parameter set device capable of changing and fixing a predetermined kind of parameter for multiple recording for at least one of the signal light and the reference light, the method comprising:
- a move process of moving the hologram record medium by the move device; and
- a control process of controlling the parameter set device to perform a recording by using the parameter used for the last recording at the m-th focus position, m is a natural number, as the parameter for the first recording at the (m+1)-th focus position.

8. A multiple record type hologram reproduction method comprising: a light source for irradiating the multiple record type hologram record medium with reproduction illumination light; a photoreceptor for receiving reproduction light based on the reproduction illumination light from the hologram record medium; a read device for reading record information recorded on the hologram record medium on the basis of the received reproduction light; a move device for moving a focus position of the reproduction illumination light relative to the hologram record medium in a direction along a surface of the hologram record medium; and a parameter set device capable of changing and fixing a predetermined kind of parameter for multiple recording relating to the reproduction illumination light, the method comprising:
- a move process of moving the hologram record medium by the move device; and
- a control process of controlling the parameter set device to perform a reproduction by using the parameter used at the last reproduction at the m-th focus position, m is a natural number, as the parameter for the first reproduction at the (m+1)-th focus position.

* * * * *